US007961039B2

(12) United States Patent
Casper et al.

(10) Patent No.: US 7,961,039 B2

(45) Date of Patent: Jun. 14, 2011

(54) FORWARDED CLOCK FILTERING

(75) Inventors: Bryan K. Casper, Hillsboro, OR (US); Timothy Hollis, Spanish Fork, UT (US); James E. Jaussi, Hillsboro, OR (US); Stephen R. Mooney, Beaverton, OR (US); Frank O'Mahony, Portland, OR (US); Mozhgan Mansuri, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/536,224

(22) Filed: Aug. 5, 2009

(65) Prior Publication Data

US 2009/0289700 A1 Nov. 26, 2009

Related U.S. Application Data

(62) Division of application No. 11/323,310, filed on Dec. 30, 2005, now Pat. No. 7,573,326.

(51) Int. Cl.
*H03B 1/00* (2006.01)

(52) U.S. Cl. ........................................ 327/553; 327/551

(58) Field of Classification Search ......................... None
See application file for complete search history.

(56) References Cited

U.S. PATENT DOCUMENTS

| | | | | |
|---|---|---|---|---|
| 2,976,408 | A * | 3/1961 | Colaguori | 455/205 |
| 3,835,399 | A * | 9/1974 | Holmes | 327/555 |
| 4,316,108 | A * | 2/1982 | Rogers, Jr. | 327/553 |
| 4,888,502 | A | 12/1989 | Jarrett et al. | |
| 5,353,313 | A | 10/1994 | Honea | |
| 6,597,592 | B2 | 7/2003 | Carsten | |
| 6,677,822 | B2 | 1/2004 | Hasegawa | |
| 6,765,417 | B1 | 7/2004 | Mallinson | |
| 6,768,372 | B2 | 7/2004 | Jaussi | |
| 7,123,729 | B2 | 10/2006 | Sendelweck | |
| 7,307,473 | B2 | 12/2007 | Kusunoki et al. | |
| 7,573,326 | B2 | 8/2009 | Casper et al. | |
| 2007/0152746 | A1 | 7/2007 | Casper et al. | |
| 2009/0154614 | A1* | 6/2009 | Storm et al. | 375/344 |

OTHER PUBLICATIONS

"Chinese Application Serial No. 200610172496.6, Office Action mailed Feb. 13, 2009", 17 pgs.

"Chinese Application Serial No. 200610172496.6, Office Action mailed Mar. 1, 2010", 5 pgs.

"Chinese Application Serial No. 200610172496.6, Office Action mailed Jul. 12, 2010", 4 pgs.

* cited by examiner

*Primary Examiner* — Cassandra Cox

(74) *Attorney, Agent, or Firm* — Schwegman, Lundberg & Woessner, P.A.

(57) ABSTRACT

Some embodiments include a tunable bandpass filter to provide a filtered output signal; a circuit portion to provide an output signal in response to the filtered output signal; a comparator circuit to provide a comparison signal in response to the output signal from the circuit portion; and a feedback circuit to tune the tunable bandpass filter in response to the comparison signal provided by the comparator circuit. Other embodiments are described and claimed.

16 Claims, 8 Drawing Sheets

706 CONTROLLER
3b
CLK
$\overline{CLK}$
BAND-PASS FILTER
702
CLK
$\overline{CLKo}$
PHASE ROTATOR
704
DATA
$\overline{DATA}$
708

FORWARDED CLOCK FILTERING

RELATED APPLICATION

This application is a divisional of U.S. application Ser. No. 11/323,310, filed Dec. 30, 2005 now U.S. Pat. No. 7,573,326, which is incorporated herein its entirety by reference.

FIELD

Embodiments of the present invention relate to circuits, and more particularly, to clock recovery circuits.

BACKGROUND

Forwarded-clocking utilizes a dedicated clock transmitter to send a sub-rate clock signal in parallel with data signals on a parallel bus. In many cases, a forwarded-clock signal accumulates significant frequency jitter due to power supply noise, common mode noise, and channel losses.

DESCRIPTION OF EMBODIMENTS

Figure 1:
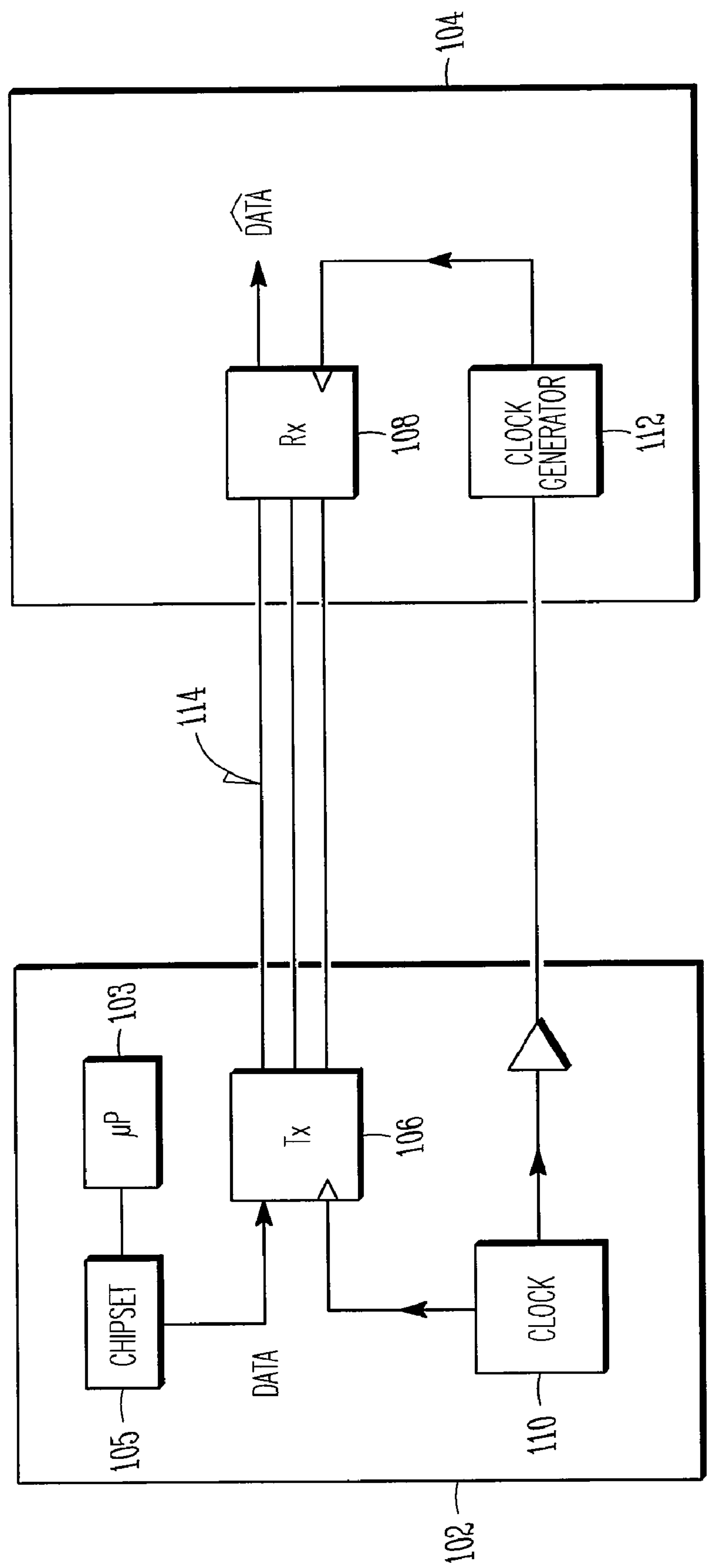
FIG. 1 is a high-level abstraction of a system utilizing an embodiment of the present invention

Embodiments of the present invention may find application to various systems, such as for communicating data from a computer system to some other system, such as memory or another computer system. This is illustrated at a high level in FIG. 1. In FIG. 1, data is exchanged between devices 102 and 104, where for simplicity only one direction of data communication is indicated by transmitter 106 and receiver 108. Device 102 or 104 may be a board, or part of a die, for transmitting data. In the particular example of FIG. 1, device 102 comprises part of a computer system, comprising microprocessor 103 and chipset 105. Clock unit 110 provides a clock signal to transmitter 106 and provides a clock signal (forwarded-clock signal) to clock generator unit 112 on device 104. The clock signal transmitted from device 102 to device 104 is synchronous with the data signal transmitted from device 102 to device 104. Clock generator unit 112 receives the transmitted clock signal from device 102, and in response provides a clock signal to receiver 108 to recover data sent via parallel bus 114. Embodiments of the present invention may be utilized in clock generator unit 112.

Figure 2:
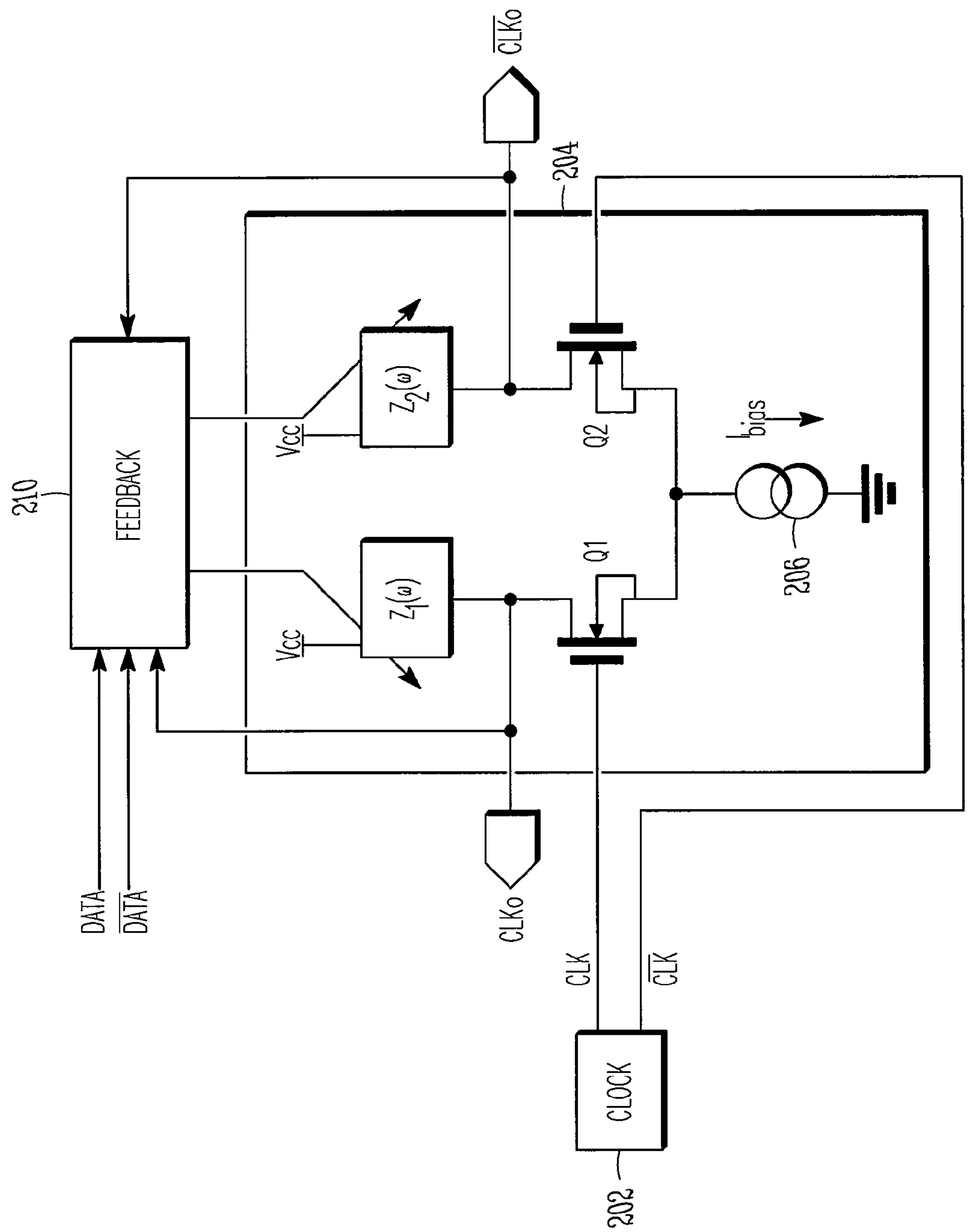
FIG. 2 illustrates an embodiment of the present invention encompassing a feedback circuit and a tunable filter.

FIG. 2 illustrates a high-level functional description of embodiments to reduce clock signal jitter. The forwarded-clock signal is provided by clock unit 202 to active filter 204.

The forwarded-clock signal is a differential signal, denoted by the signals Clk and $\overline{\text{Clk}}$, which may have jitter. The binary values represented by the signal $\overline{\text{Clk}}$ are complementary to the binary values represented by the signal Clk. Filter 204 is a tunable bandpass filter, providing a gain greater than one in magnitude for some range of frequencies in its passband. More particularly, for some embodiments, filter 204 comprises a differential pair of nMOS transistors Q1 and Q2, where their gates serve as (or are connected to) the input ports to filter 204. By a “differential pair”, it is meant that the betas of transistors Q1 and Q2 are matched. Current source 206 provides a bias current to the differential pair. Load $Z_1(w)$ is coupled to the drain of nMOS transistor Q1, and load $Z_2(w)$ is coupled to the drain of nMOS transistor Q2. These loads are tunable in the sense that their reactive components may be varied. These loads affect the bandpass spectrum, where they present a relatively high (in magnitude) impedance to the drains of transistors Q1 and Q2 for those frequencies within the passband region of filter 204, and present a relatively low (in magnitude) impedance outside the passband region of filter 204.

Output ports labeled with the signals $\text{Clk}_0$ and $\overline{\text{Clk}}_0$ provide the filtered differential signal developed at the drains of nMOS transistors Q1 and Q2. (For simplicity, in this description we may use the same label for a signal and its associated port.) This filtered clock signal is provided to feedback unit 210. In some embodiments, feedback unit 210 also receives a pair of data signals, Data and $\overline{\text{Data}}$, where $\overline{\text{Data}}$ is the logical complement of Data, and Data represents a known sequence. For example, in some embodiments, Data is a signal representing the binary sequence of alternating 1's and 0's, that is, 1010101010 . . . . Feedback unit 210 tunes loads $Z_1(w)$ and $Z_2(w)$ so that tunable filter 204 filters out at least a portion of the jitter that may be present in the differential clock signals Clk and $\overline{\text{Clk}}$. This will be described in more detail after considering an embodiment for tunable filter 204.

Figure 3:
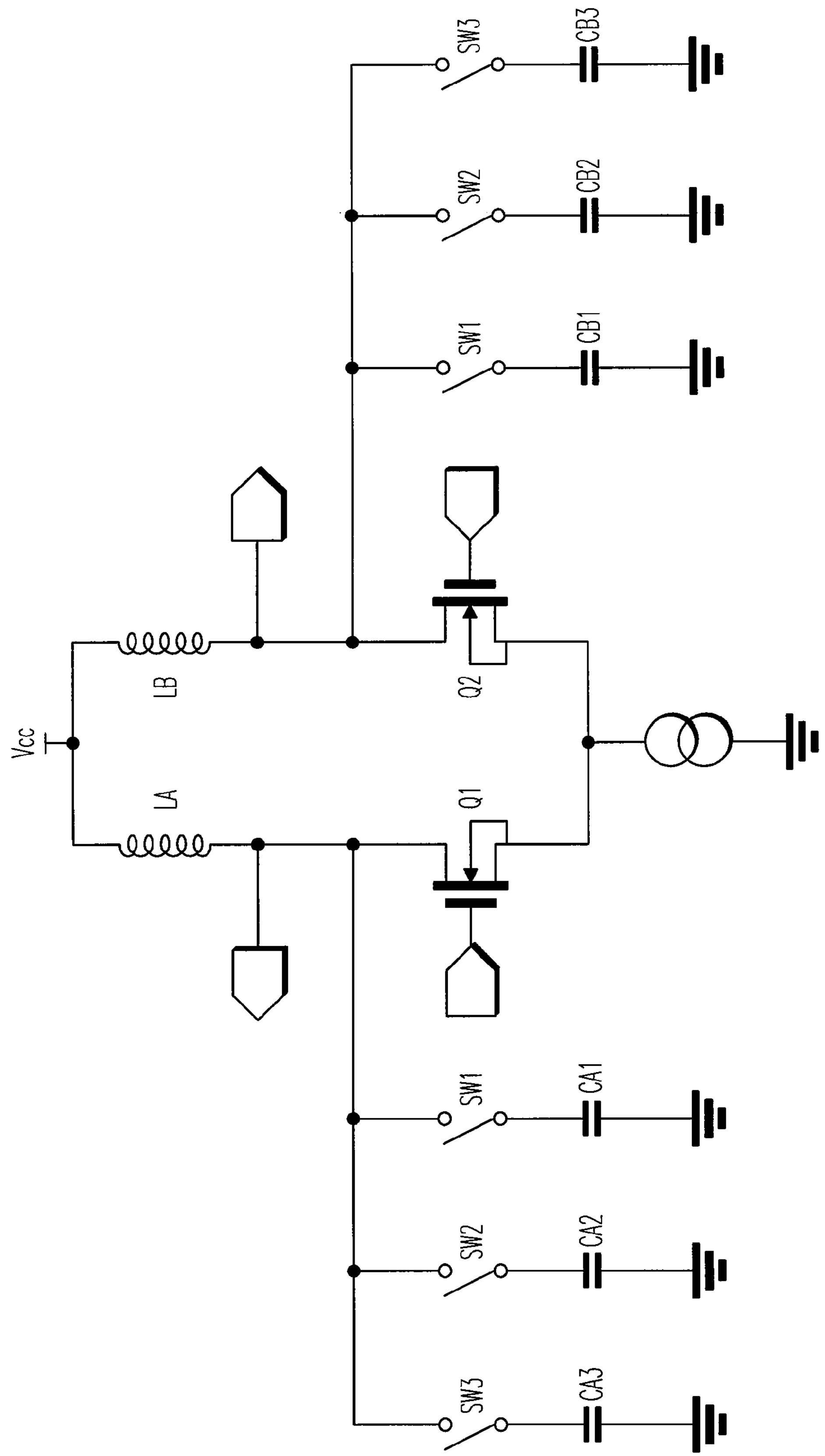
FIG. 3 illustrates an embodiment tunable filter circuit that may be utilized in the embodiment of FIG. 2.

A more detailed example of an embodiment tunable active filter 204 is illustrated in FIG. 3. Comparing to FIG. 2, load $Z_1(w)$ is provided by the combination of inductor LA and capacitors CA1, CA2, and CA3; and load $Z_1(w)$ is provided by the combination of inductor LB and capacitors CB1, CB2, and CB3. These loads are tunable by setting switches SW1, SW2, and SW3. Accordingly, 3 bits of information set the switching state of the embodiment tunable filter of FIG. 3. Other embodiments may use more or less bits of information to set the switches. One may take the convention that a 0 bit value sets a corresponding switch OFF and a 1 bit value sets a corresponding switch ON, but of course, the complementary convention may be followed as well.

For symmetrical operation, in some embodiments the capacitances of CA1 and CB1 may be set equal to each other, the capacitances of CA2 and CB2 may be set equal to each other, the capacitances of CA3 and CB3 may be set equal to each other, and the inductances of LA and LB may be set to each other. Using the label of a capacitor to also denote its capacitance, for some embodiments the capacitances may be related to each by powers of 2, whereby CA2=2·CA1 and CA3=2·CA2. However, for other embodiments, the capacitances may be related to each other in a different manner, and need not necessarily follow any symmetry properties.

When viewing the tunable filter in FIG. 2 or FIG. 3 as an amplifier, its small-signal gain is largest in magnitude for those frequencies in which the impedances $Z_1(w)$ and $Z_2(w)$ loading the drains of transistors Q1 and Q2 are largest in magnitude. For the embodiment of FIG. 3, each load is a resonant circuit, having an impedance peaked in magnitude about a resonant frequency, so that the amplifier operates as a bandpass filter. For the embodiment of FIG. 3, the resonant frequency is lowered as the number of capacitors switched into the circuit increase. In this way, the amplifier is tuned by setting the switches.

The embodiment in FIG. 3 abstracts the loads as lumped-parameter inductors and capacitors, so that the resulting load is purely reactive. For example, the device loading transistor Q1 comprises one lumped-parameter inductor LA and capacitors CA1, CA2, and CA3. In practice, however, the loads will also have some resistance as well, so that their complex impedances will have a real component in addition to an imaginary component. Furthermore, in some embodiments, the loads may have distributed inductance and capacitance.

Figure 4:
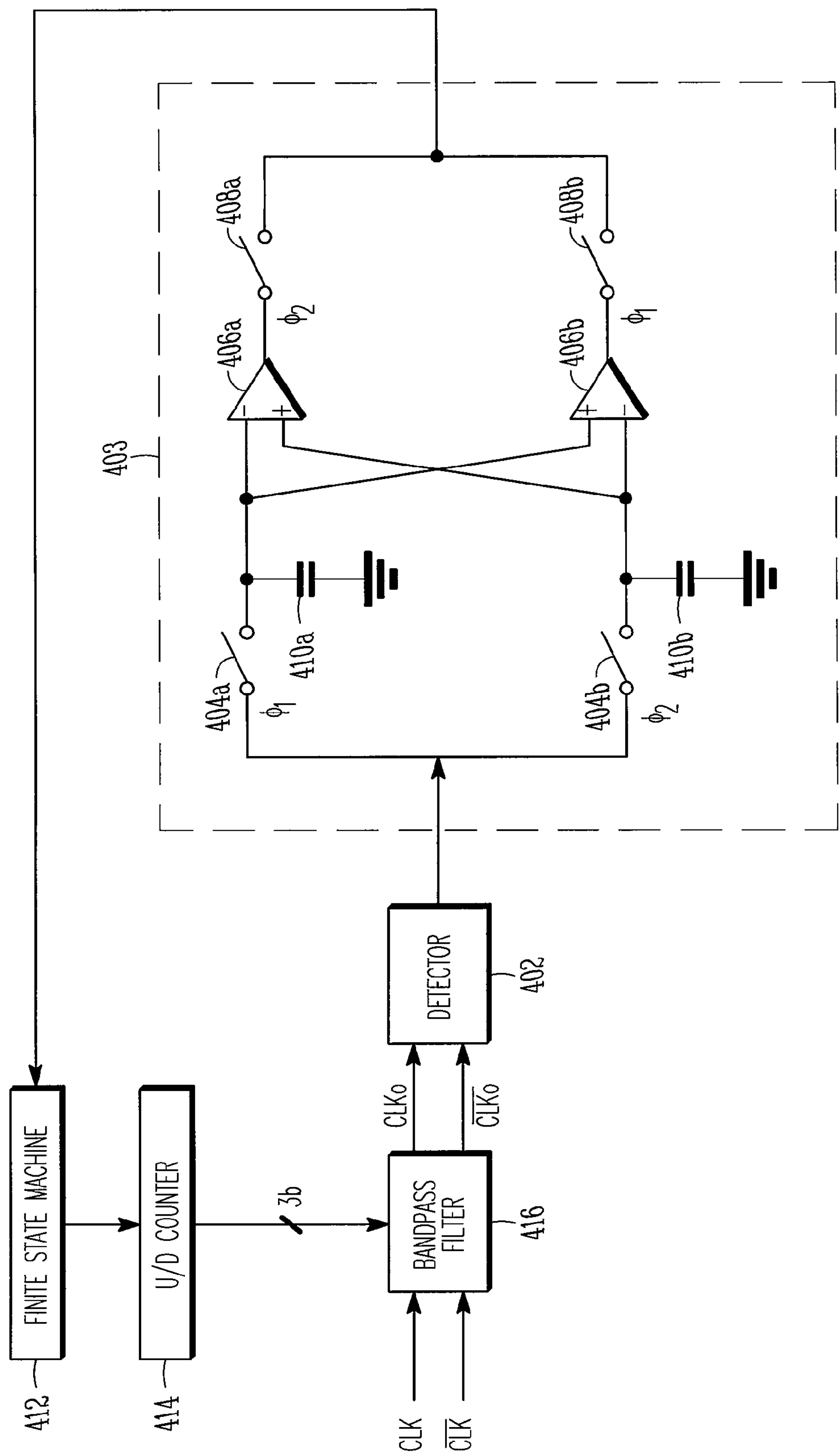
FIG. 4 is another embodiment of the present invention in which the tunable filter is tuned in response to a measured magnitude of the tunable filter output.

Various circuits may be utilized for feedback unit 210. An embodiment is shown in FIG. 4, where for simplicity we have represented the tunable filter as a block labeled as bandpass filter 416. Detector 402 and comparator circuit 403 are used to measure and sample the magnitude of the filtered output differential clock signal, and to provide a signal indicative as to whether a sample of the magnitude of the filtered output differential clock signal has increased or decreased compared to a previous such sample.

For a constant input signal, the small-signal differential gain is proportional to the magnitude of the differential output signal. Consequently, by measuring the magnitude of the filtered output differential clock signal, the embodiment of FIG. 4 is also indirectly measuring the small-signal differential gain of the filter. As discussed below in more detail, the embodiment filter of FIG. 4 is tuned, based upon these measurements, to in some sense "maximize" its small-signal differential gain. This "maximization" is not meant to be understood as an exact characterization of the embodiment of FIG. 4, but only as approximate description to aid in the understanding of the embodiment.

Comparator circuit 403 comprises switches 404*a* and 404*b*, capacitors 410*a* and 410*b*, comparators 406*a* and 406*b*, and switches 406*a* and 406*b*. Switches 410*a* and 408*a* are switched ON and OFF by clock signal $\phi_1$ and switches 408*a* and 408*b* are switched ON and OFF by clock signal $\phi_2$, where these clock signals have the same frequency but are non-overlapping. That is, for proper operation, there should be no time intervals for which both of these clock signals are such that their respectively controlled switches are switched ON.

Detector 402 provides the magnitude of the difference between the signals $Clk_0$ and $\overline{Clk_9}$. Comparator circuit 403 provides to FSM (Finite State Machine) 412 a HIGH signal if the present sample of the output of detector 402 is greater than the previous such sample, and provides a LOW signal otherwise. FSM 412 provides a control signal to U/D (up/down) counter 414, which counts upward or downward depending upon the state of FSM 412. The numerical value stored in U/D counter 414 determines the bits provided to bandpass filter 416, which for this particular example is 3 bits, but of course other examples may have more or less such control bits.

Figure 5:
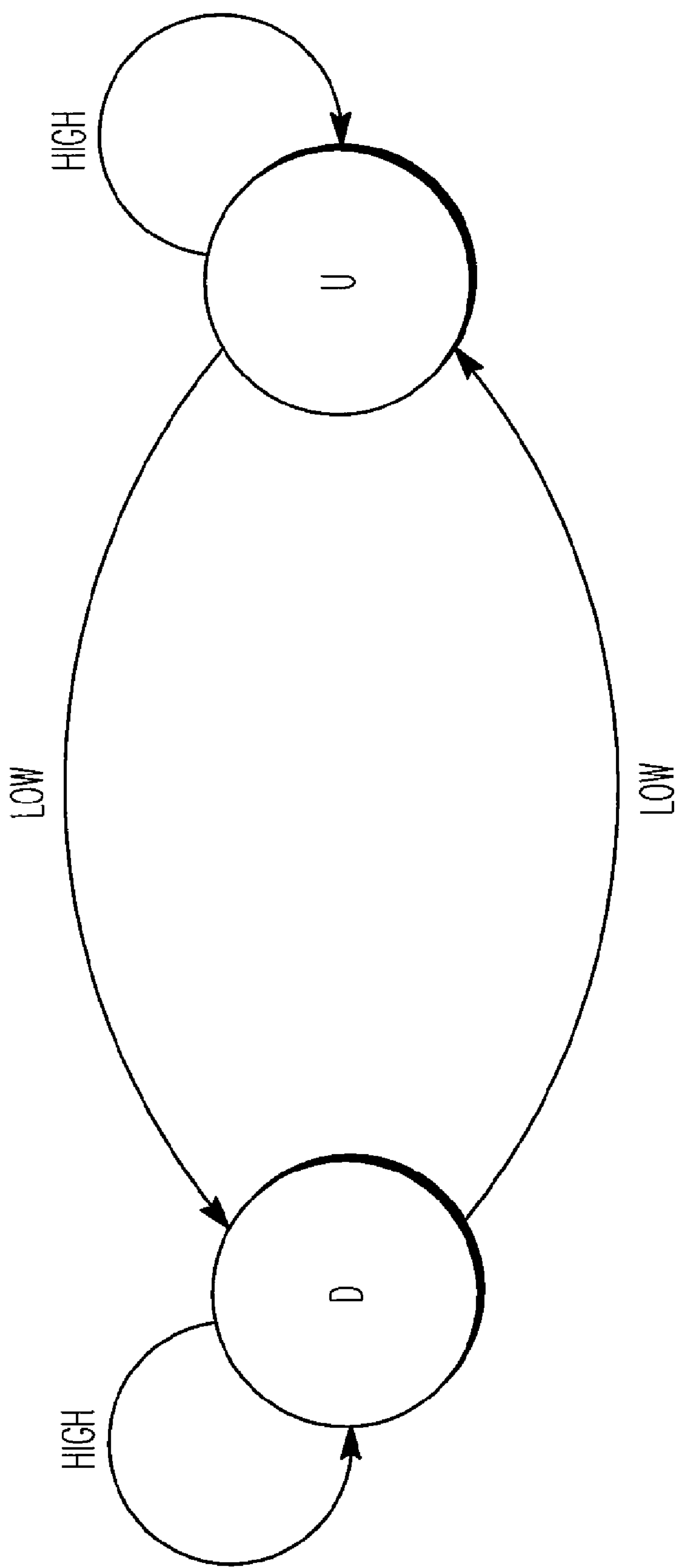
FIG. 5 is an example of a finite state machine that may be utilized in the embodiment of FIG. 4.

Various embodiments of FSM 412 may be realized for controlling U/D counter 414. For example, consider the simple two-state machine illustrated in FIG. 5. While in the state labeled U, U/D counter 414 counts upward, and while in the state labeled D, U/D counter 414 counts downward. The events causing transitions among the states are labeled as LOW or HIGH, and represent the outputs of comparator circuit 403. FSM 412 changes state if comparator circuit 403 outputs a LOW, but remains in its current state if comparator circuit 403 outputs a HIGH. Notice that with this simple two-state machine, tunable filter 416 is updated on every sampling period even if it is tuned to provide a (nearly) peak filter gain.

Figure 6:
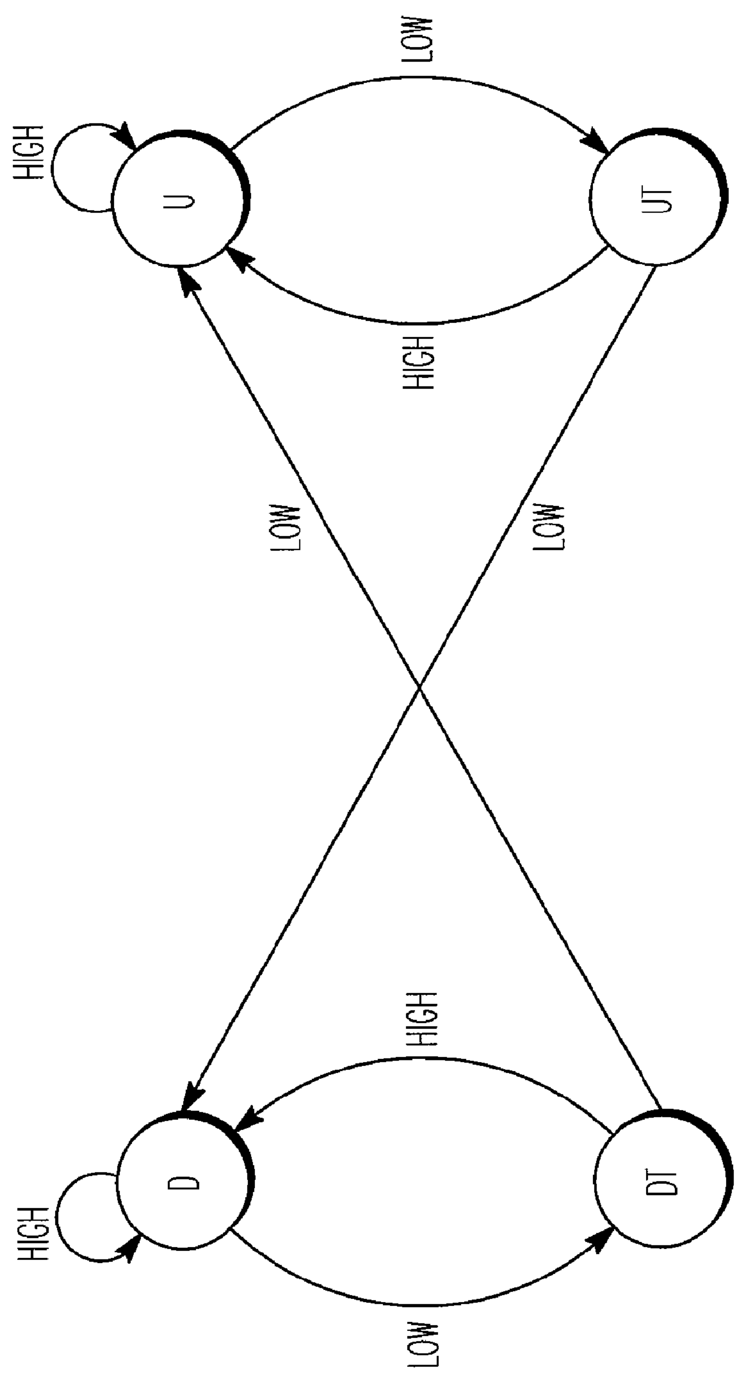
FIG. 6 is another example of a finite state machine that may be utilized in the embodiment of FIG. 4.

As another embodiment, the FSM 412 may be represented by the four-state machine of FIG. 6. In this case, there are four states, labeled D, DT, U, and UT. While in states D or DT, U/D/ counter 414 is controlled to count downward, whereas when in states U or UT, U/D counter 414 is controlled to count upward. States DT and UT may be considered as "transitional" states. In the example of FIG. 6, to change the direction in which U/D counter 414 is counting, either two consecutive LOWs or two consecutive HIGHs must be provided. In this way, if tunable filter 416 is tuned to be near it peak gain, and if this setting is optimal, then tuning of tunable filter 416 would stop, unlike for the example of FIG. 5. Many other state-diagrams may be considered for FSM 412.

Figure 7:
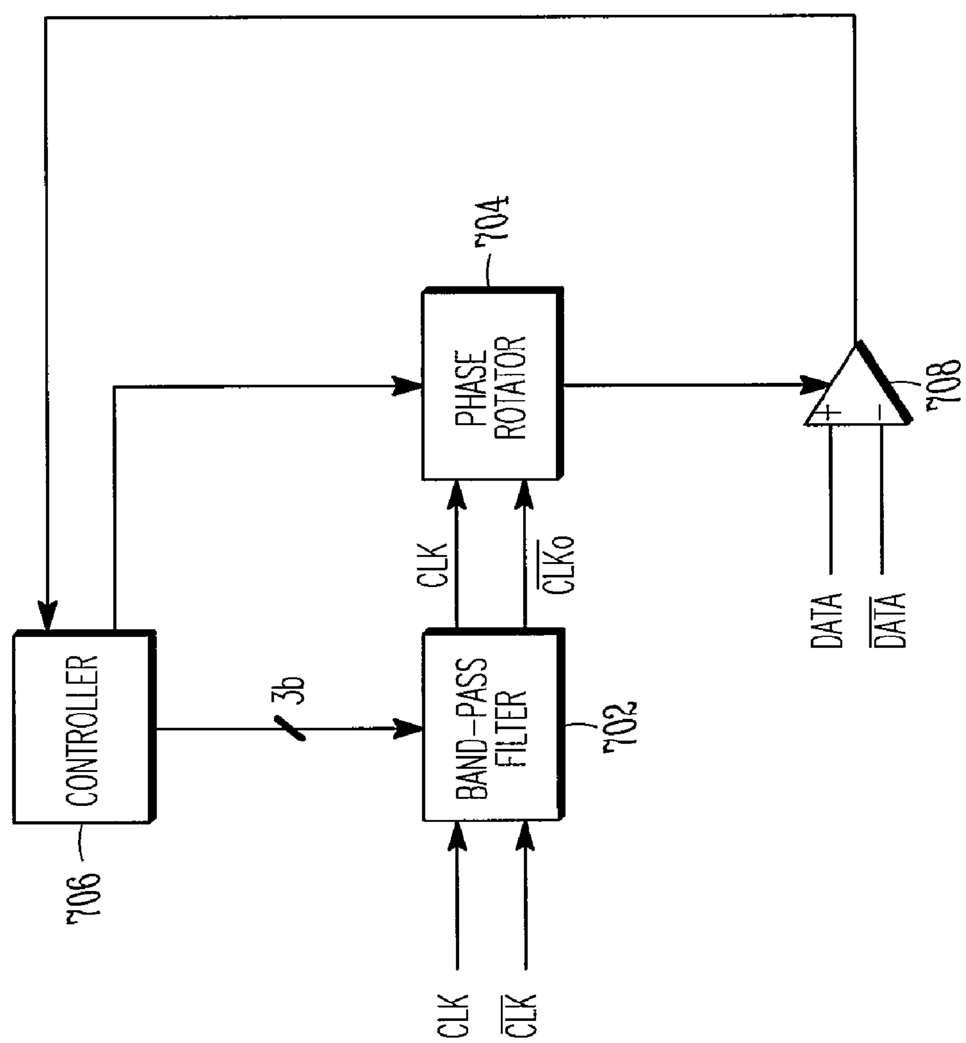
FIG. 7 is another embodiment of the present invention in which the tunable filter is tuned in response to a measured jitter in the filtered clock signal.

Another embodiment for updating the tunable filter is illustrated in FIG. 7. The differential output clock signal ($CLK_0$ and $\overline{CLK_0}$) of bandpass filter 702 is provided to phase rotator 704. Phase rotator provides an output signal synchronized to this differential output clock signal provided by bandpass filter 702, but with a phase that may be varied relative to the phase of the differential output clock signal. That is, suppose for simplicity of discussion that the filtered clock signals $CLK_0$ and $\overline{CLK_0}$ outputted by bandpass filter 702 are H(t) and its complement $\overline{H(t)}$, where H(t) is periodic so that H(t+T)=H(t) where the period T is the smallest number in magnitude for which this periodicity relationship holds. Then, the signal outputted by phase rotator 704 may be expressed as $H(t+\theta T/2\pi)$, where the phase angle θ may be taken as between 0 and 2π. The phase angle θ is controlled by controller 706. For some embodiments, phase rotator 704 may comprise a DLL (delay-lock-loop) and a phase interpolator.

The output clock signal provided by phase rotator 704 gates comparator 708, so that comparator 708 compares its two input signals only when the output clock signal provided by phase rotator 704 transitions from HIGH to LOW or from LOW to HIGH. As discussed previously, Data represents a known sequence. For example, in some embodiments, Data is a signal representing the binary sequence of alternating 1's and 0's, that is, 1010101010 . . . . For simplicity of discussion, we assume that this alternating sequence is used. However, embodiments may be easily modified if different sequences are employed.

Suppose that the phase of phase rotator 704 is tuned so that the transitions of its output signal are well within the eye of the data signals Data and $\overline{Data}$. Then, because we have assumed that the data signal is an alternating sequence of 1's and 0's, the output signal provided by comparator 708 will also represent an alternating sequence of 1's and 0's. But as the phase of phase rotator 708 is tuned so that the transitions of its output signal closely match those of the data signal, i.e., the transitions start to occur outside of the "eye openings" of the data signal and nearer to the transitions of the data signal, then the output signal provided by comparator 708 may not be exactly an alternating sequence of 1's and 0's due to phase jitter. That is, when a signal representing a 1 is expected, a signal representing a 0 may appear as an output of comparator 708, or if a signal representing a 0 is expected, a signal representing a 1 may appear.

Consequently, there will be a region of phase angles, say $[\theta_0,\theta_1]$, in which the output of comparator 708 is not the expected alternating sequence. The size of this region is an indication of the amount of phase jitter present in the clock signal provided by bandpass filter 702 to phase rotator 704. Consequently, controller 706 may be programmed, or synthesized, to tune phase rotator 704 so that the phase angle is swept from 0 to 2π, and the region of the phase angles for which comparator 708 does not provide the desired sequence signals is measured. This measurement may simply be the difference $\theta_1-\theta_0$. Of course, in practice, a finite number of bits are used to approximate this difference.

As controller 706 causes phase rotator to sweep through successive phase angle regions for which jitter is detected, a sequence of measurements is determined. For some embodiments, the difference between successive measurements may be taken, where, for ease of discussion, a positive difference between a present measurement and a previous measurement is represented by LOW, and a negative difference is represented by HIGH. Simply stated, a LOW signal indicates that jitter is getting worse, and a HIGH signal indicates that jitter is getting better.

These HIGH and LOW signals may be utilized to tune bandpass filter 702 in similar fashion as described with respect to the embodiment of FIG. 4. That is, controller 706 may also comprise a finite state machine and a U/D counter, like that of FIG. 4. However, the measured quantity for the embodiment of FIG. 7 is a metric indicative of the amount of jitter in the filtered clock signal provided by the tunable filter, whereas for the embodiment of FIG. 4, the measured quantity is a metric indicative of the small-signal differential gain of the tunable filter.

Figure 8:
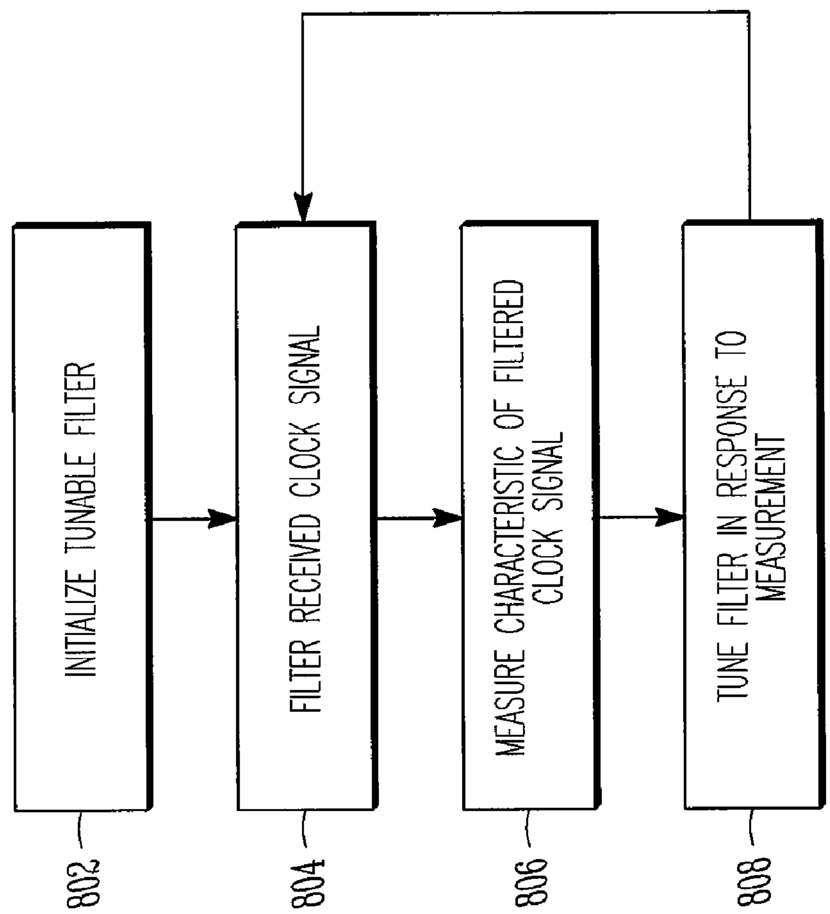
FIG. 8 is a flow diagram illustrating some embodiments of the present invention.

The embodiments described above may be abstracted by the flow diagram shown in FIG. 8. Before tuning the filter, the loads in the filter may be initialized to some initial complex impedance value, as indicated in block 802. Block 804 indicates that the filter is applied to the received clock signal to generate a filtered clock signal, and in block 806, a measurement on a characteristic (or characteristics) of the filtered clock signal is performed. For example, the measured characteristic may be the magnitude of the filtered clock signal, e.g., $|Clk_0-\overline{Clk}_0|$, as discussed with respect to the embodiment of FIG. 4, or the range of angles over which jitter is detected, as discussed with respect to the embodiment of FIG. 7. As Block 808 indicates, the filter is tuned in response to the measurement, or measurements, performed in block 806. If desired, the process may repeat itself, as indicated in FIG. 8 by returning control from block 808 to block 804. However, in practice, filter tuning may not be a continuous process, For example, the filter may be updated (tuned) only during an initialization period, or as another example, the filter may be updated periodically.

Various modifications may be made to the disclosed embodiments without departing from the scope of the invention as claimed below. Some of the functional units described herein may be realized by hardwired circuits, programmable logic, or programmable processors, or combinations thereof, which may utilize firmware or software, or combinations thereof.

Although embodiments were described as processing differential signals, other embodiments may be realized in which the signals of interest are single-ended.

Embodiments of the tunable filter may employ pMOS transistors for the differential pair instead of nMOS transistors. Furthermore, the capacitors may be realized by various techniques, such as connecting together the source and drain of a transistor to form one of the terminals of the resulting capacitor.

In general, a load will have an inductive component and a capacitive component, as well as a resistive component. For example, part of the stored energy in a passive reactive device will be magnetic in nature, thereby defining an inductive component, and part of the stored energy will be electric in nature, thereby defining a capacitive component. Generally, when tuning a tunable load, the relative amounts of the inductive and capacitive components will change. In the particular embodiment of FIG. 3, the tunable loads are tuned by switching in or out various capacitors, thereby changing the capacitive components of the loads. However, in other embodiments, a load may be tuned by tuning its inductive component rather than its capacitive component. For example, various inductors may be switched in or out of the circuit. Or, in other embodiments, the loads may be tuned by tuning both their inductive and capacitive components, so that the relative amounts of these components change.

It is to be understood in these letters patent that the meaning of "A is connected to B", where A or B may be, for example, a node or device terminal, is that A and B are directly connected to each other by one or more conductors, or by one or more semiconductors meant to serve as conductors, such as an interconnect, transmission line, etc. In integrated circuit technology, the "interconnect" may be exceedingly short, comparable to the device dimension itself. For example, the gates of two transistors may be connected to each other by polysilicon or copper interconnect that is comparable to the gate length of the transistors. As another example, A and B may be connected to each other by a switch, such as a transmission gate, so that their respective voltage potentials are substantially equal to each other when the switch is ON.

It is also to be understood that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements. For example, A may be connected to a circuit element which in turn is connected to B. Or A may be coupled to B via a magnetic or electric field.

It is also to be understood in these letters patent that a "current source" may mean either a current source or a current sink. Similar remarks apply to similar phrases, such as, "to source current".

It is also to be understood in these letters patent that various circuit blocks, such as current mirrors, amplifiers, etc., may include switches so as to be switched in or out of a larger circuit, and yet such circuit blocks may still be considered connected to the larger circuit because the various switches may be considered as included in the circuit block.

Throughout the description of the embodiments, various mathematical relationships are used to describe relationships among one or more quantities. For example, a mathematical relationship may express a relationship by which a quantity is derived from one or more other quantities by way of various mathematical operations, such as addition, subtraction, multiplication, division, etc. More simply, a quantity may be set to some known value, such as a real number, which is merely a trivial mathematical relationship. These numerical relationships are in practice not satisfied exactly, and should therefore be interpreted as "designed for" relationships. That is, one of ordinary skill in the art may design various working embodiments to satisfy various mathematical relationships, but these relationships can only be met within the tolerances of the technology available to the practitioner. Accordingly, in the following claims, the word "substantially" is used to reflect this fact. For example, a claim may recite that one resistance is substantially equal to another resistance, or that one voltage is substantially equal to another voltage. Or, a claim may relate one quantity to one or more other quantities by way of stating that these quantities substantially satisfy or are substantially given by a mathematical relationship or equation. It is to be understood that "substantially" is a term of art, and is meant to convey the principle discussed above that mathematical relationships, equalities, and the like, cannot be met with exactness, but only within the tolerances of the technology available to a practitioner of the art under discussion.

What is claimed is:

1. A circuit comprising:

a tunable bandpass filter to provide a filtered output signal based on an input signal, the tunable bandpass filter including a transistor having a drain and a gate, the gate responsive to the input signal, the tunable bandpass filter further including a tunable load having a resonant frequency coupled to the drain of the transistor;

a circuit portion to provide an output signal in response to the filtered output signal;

a comparator circuit to provide a comparison signal in response to the output signal from the circuit portion; and a feedback circuit to tune the tunable bandpass filter in response to the comparison signal provided by the comparator circuit.

2. The circuit as set forth in claim 1, wherein the circuit portion includes phase rotator to provide the output signal, such that the output signal is synchronized to the filtered output signal and has a phase angle relative to the filtered output signal.

3. The circuit as set forth in claim 2, wherein the comparator comprises a first input port to have a first input voltage and a second input port to have a second input voltage, and the comparison signal is indicative of a comparison between the first and second input port voltages during a transition of the signal provided by the circuit portion from LOW to HIGH and from HIGH to LOW.

4. The circuit as set forth in claim 1, wherein the feedback circuit comprises a controller to control the phase rotator so that the phase angle is periodically swept over a set of angles, wherein each sweep over the set of angles provides a range of angles for which the comparison signal is indicative of phase jitter in the filtered output signal.

5. A circuit comprising:

a tunable bandpass filter to provide a filtered output signal;

a circuit portion to provide an output signal in response to the filtered output signal;

a comparator circuit to provide a comparison signal in response to the output signal from the circuit portion, wherein the circuit portion includes a detector to provide the output signal, such that the output signal is indicative of a magnitude of the filtered output signal; and a feedback circuit to tune the tunable bandpass filter in response to the comparison signal provided by the comparator circuit.

6. The circuit as set forth in claim 5, wherein the comparison signal is indicative of comparing a first sample of the magnitude of the filtered output signal with a second sample of the magnitude of filtered output signal, wherein the first sample is previous in time to the second sample.

7. A circuit comprising:

a tunable bandpass filter to provide a filtered output signal;

a circuit portion to provide an output signal in response to the filtered output signal;

a comparator circuit to provide a comparison signal in response to the output signal from the circuit portion; and a feedback circuit to tune the tunable bandpass filter in response to the comparison signal provided by the comparator circuit, wherein the feedback circuit comprises a finite state machine having at least a first state and a second state, wherein the feedback circuit is coupled to the tunable bandpass filter to tune the load so as to increase its capacitive component relative to its inductive component if the finite state machine is in the first state, and to tune the load so as to decrease its capacitive component relative to its inductive component if the finite state machine is in the second state.

8. A circuit comprising:

a tunable bandpass filter to provide a filtered output signal;

a detector to provide a signal indicative of a magnitude of the filtered output signal;

a comparator circuit to provide a comparison signal indicative of comparing a first sample of the magnitude of the filtered output signal with a second sample of the magnitude of filtered output signal, wherein the first sample is previous in time to the second sample; and a feedback circuit to tune the tunable bandpass filter in response to the comparison signal provided by the comparator circuit.

9. The circuit as set forth in claim 8, wherein the tunable bandpass filter comprises a load having an inductive component and a capacitive component, the feedback circuit to change the capacitive component relative to the inductive component in response to the comparison signal.

10. The circuit a set forth in claim 9, wherein the feedback circuit comprises a finite state machine having at least a first state and a second state, wherein the feedback circuit is coupled to the tunable bandpass filter to tune the load so as to increase its capacitive component relative to its inductive component if the finite state machine is in the first state, and to tune the load so as to decrease its capacitive component relative to its inductive component if the finite state machine is in the second state.

11. The circuit as set forth in claim 8, wherein the filtered output signal is a differential signal comprising a first output signal and a second output signal, wherein the detector provides a signal indicative of a magnitude of the difference between the first and second output signals.

12. A circuit comprising:

a tunable bandpass filter to provide a filtered output signal based on an input signal, the tunable bandpass filter including a transistor having a drain and a gate, the gate responsive to the input signal, the tunable bandpass filter further including a tunable load having a resonant frequency coupled to the drain of the transistor;

a phase rotator to provide an output signal, wherein the output signal is synchronized to the filtered output signal and has a phase angle relative to the filtered output signal;

a comparator comprising a first input port to have a first input voltage and a second input port to have a second input voltage, wherein the comparator is coupled to the phase rotator to provide a comparison signal indicative of a comparison between the first and second input port voltages during a transition of the phase rotator output signal from LOW to HIGH and from HIGH to LOW; and a feedback circuit to tune the tunable bandpass filter in response to the comparison signal.

13. The circuit as set forth in claim 12, wherein the feedback circuit comprises a controller to control the phase rotator so that the phase angle is periodically swept over a set of angles, wherein each sweep over the set of angles provides a range of angles for which the comparison signal is indicative of phase jitter in the filtered output signal.

14. The circuit as set forth in claim 13, the circuit to provide a binary signal indicative of comparing a first range of angles for which the comparison signal is indicative of phase jitter with a second range of angles for which the comparison signal is indicative of phase jitter, wherein the first range of angles is previous in time to the second range of angles.

15. The circuit as set forth in claim 14, the feedback circuit to tune the bandpass filter in response to the binary signal.

16. The circuit as set forth in claim 12, wherein the filtered output signal is a differential signal.

* * * * *